(12) United States Patent
Ichihashi et al.

(10) Patent No.: US 6,504,652 B1
(45) Date of Patent: Jan. 7, 2003

(54) APPARATUS AND METHOD FOR LASER PROCESSING

(75) Inventors: Koki Ichihashi, Kanagawa (JP);
Hidehiko Karasaki, Hyogo (JP);
Nobuaki Furuya, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 47 days.

(21) Appl. No.: 09/690,747

(22) Filed: Oct. 18, 2000

(30) Foreign Application Priority Data

Oct. 21, 1999 (JP) .......................................... 11-299677

(51) Int. Cl.[7] .......................... G02B 3/00; G01B 11/00; G03B 27/54
(52) U.S. Cl. ........................ 359/649; 359/724; 359/670; 359/671; 359/708; 359/726; 359/728; 359/739; 359/799; 359/800; 359/801; 359/802; 356/399; 356/400; 355/67; 355/71; 250/201.9; 250/548
(58) Field of Search ................................. 359/649–651, 359/724, 670, 671, 708, 717, 726–731, 738, 739, 799–802; 355/67–71; 356/399, 400; 250/201.9, 548

(56) References Cited

U.S. PATENT DOCUMENTS

| 3,476,463 | A | | 11/1969 | Kreuzer ....................... 359/717 |
|---|---|---|---|---|
| 5,379,090 | A | * | 1/1995 | Shiraishi ....................... 355/53 |
| 6,392,742 | B1 | * | 5/2002 | Tsuji ........................ 250/492.2 |
| 6,404,499 | B1 | * | 6/2002 | Stoeldraijer et al. ... 250/492.22 |
| 6,433,854 | B2 | * | 8/2002 | Baker et al. ................... 355/77 |
| 2002/0048008 | A1 | * | 11/2001 | Shiraishi et al. ............... 355/67 |
| 2002/0080338 | A1 | * | 12/2001 | Taniguchi ..................... 355/67 |
| 2002/0097387 | A1 | * | 7/2002 | Komatsuda et al. .......... 355/67 |
| 2002/0109827 | A1 | * | 8/2002 | Nishi .......................... 355/53 |

FOREIGN PATENT DOCUMENTS

| JP | 8-2511 | 1/1996 |
|---|---|---|
| JP | 10-153750 | 6/1998 |

OTHER PUBLICATIONS

Gaussian Laser Beam Profile Shaping by Fred M. Dickey et al., Optical Engineering, vol. 35, No. 11, ISSN 0091–3286, Nov. 1996, pp. 3285–3295.
"Refractive Optical Systems for Irradiance Redistribution of Collimated Radiation: Their design and Analysis" Applied Optics, vol. 19, No. 20, October 15, 1980, pp. 3545–3553.

* cited by examiner

*Primary Examiner*—Evelyn A Lester
(74) *Attorney, Agent, or Firm*—Wenderoth, Lind & Ponack, L.L.P.

(57) ABSTRACT

A $CO_2$ laser beam 12 is converted into a beam of uniform intensity at the position of a phase matching element 15 by an intensity converting element 14 and the phase matching element 15. Then, the uniform intensity beam irradiates a mask 17 containing an aperture variable in size via a variable-magnification projecting optical system 16. At the time of irradiation, the laser beam at the position of the phase matching element 15 is projected onto the mask 17 at a magnification factor most suited to the size of the aperture formed in the mask 17. Further, the pattern of the mask 17 is projected onto a workpiece 19. Thus, a uniform intensity distribution of the laser beam is obtained on the workpiece and high quality laser processing becomes possible.

22 Claims, 7 Drawing Sheets

APPARATUS AND METHOD FOR LASER PROCESSING

FIELD OF THE INVENTION

The present invention relates to an apparatus and a method for laser processing and, more particularly, relates to an apparatus and a method for performing laser processing by projecting an image of a mask, in which an aperture in An arbitrary pattern is formed, on a workpiece.

BACKGROUND OF THE INVENTION

A conventional technology related to a laser processing apparatus will be described with reference to a drawing.

FIG. 7 is a schematic diagram showing a configuration of a conventional laser processing apparatus. In FIG. 7, a laser beam 72 emitted from a laser oscillator 71 is passed through a lens system 73 and thrown onto a mask 74. Mask 74 contains an aperture whose opening is variable or fixed. There are cases where the opening of the aperture in the mask is varied according to the size of the hole to be formed in the workpiece and where masks having apertures of different openings are selectively used according to the need in each processing step. Lens system 73 is designed such that the beam diameter of laser beam 72 incident on the mask and the curvature radius of the wave surface produce optimum conditions for the processing. A projecting lens 75 projects the image of the mask onto a workpiece 76 and thereby holes are bored in a workpiece such as a printed board.

Further, such arrangements are devised in the prior art to scan a laser beam using a galvano-mirror or to speedily shift stages between steps of processing so that as many steps of processing as possible may be made in a short time.

However, conventional laser processing apparatus had problems as follows:

In performing laser processing for such work as hardening, welding, and making a hole or the like in a resin impregnated laminated substrate containing a lot of glass fibers, it is desired that the intensity distribution of the laser beam on the workpiece be uniform. However, in many cases when $CO_2$ laser, YAG laser, or the like is used, the intensity of the laser beam is stronger in the vicinity of the optical axis and becomes weaker exponentially as it goes toward the circumference, i.e., the intensity distribution becomes close to the Gaussian distribution. When such a laser beam is used for example in boring a hole in a resin impregnated laminated substrate, long projections of fibers are produced on the inner wall of the via-hole and this causes defects of metal plating performed in a subsequent process.

Further, a conventional laser processing apparatus is designed to sufficiently magnify the laser beam with respect to the aperture in the mask using a collimator and use only the strong rays along the optical axis and in its vicinity for processing. When such a design is carried out, the energy of the laser beam blocked by the screening portion of the mask becomes large and, hence, energy efficiency is decreased.

Further, in another type of conventional laser processing apparatus, a multimode laser beam is generated, and the laser beam whose intensity distribution is thus made virtually uniform is used. However, in a multimode laser beam, the mode pattern generally varies with changes of the laser output and the intensity distribution tends to fluctuate. As a result, such a problem arises that the intensity distribution on the processed surface fluctuates and, hence, it becomes impossible to stabilize the processing performance.

SUMMARY OF THE INVENTION

The laser processing apparatus of the invention comprises a mask for limiting the transmission area of a laser beam to an arbitrary shape, a variable-magnification optical system for projecting the laser beam with a uniform intensity distribution at a predetermined position onto the mask at a magnification factor suited to the transmission area of the mask, and an optical system for projecting the mask pattern onto a workpiece. By the use of the laser processing apparatus of the invention, a uniform intensity distribution of the laser beam in compliance with the size of the mask pattern can be obtained on the workpiece and, hence, high quality laser processing can be made.

The invention further comprises a means for making the intensity distribution of the laser beam uniform at a predetermined position. The means comprises an intensity converting element for making uniform the intensity distribution of the laser beam and a phase matching element for matching the phase of the laser beam once distorted by the intensity converting element.

The invention further has, within the means for making uniform the intensity distribution of the laser beam, a lens system disposed in front of the intensity converting element for limiting variations of the beam diameter of the laser beam entering the intensity converting element.

DESCRIPTION OF THE PREFERRED EMBODIMENT

Exemplary embodiments of the present invention will be described with reference to the accompanying drawings.

Embodiment 1

Figure 1:
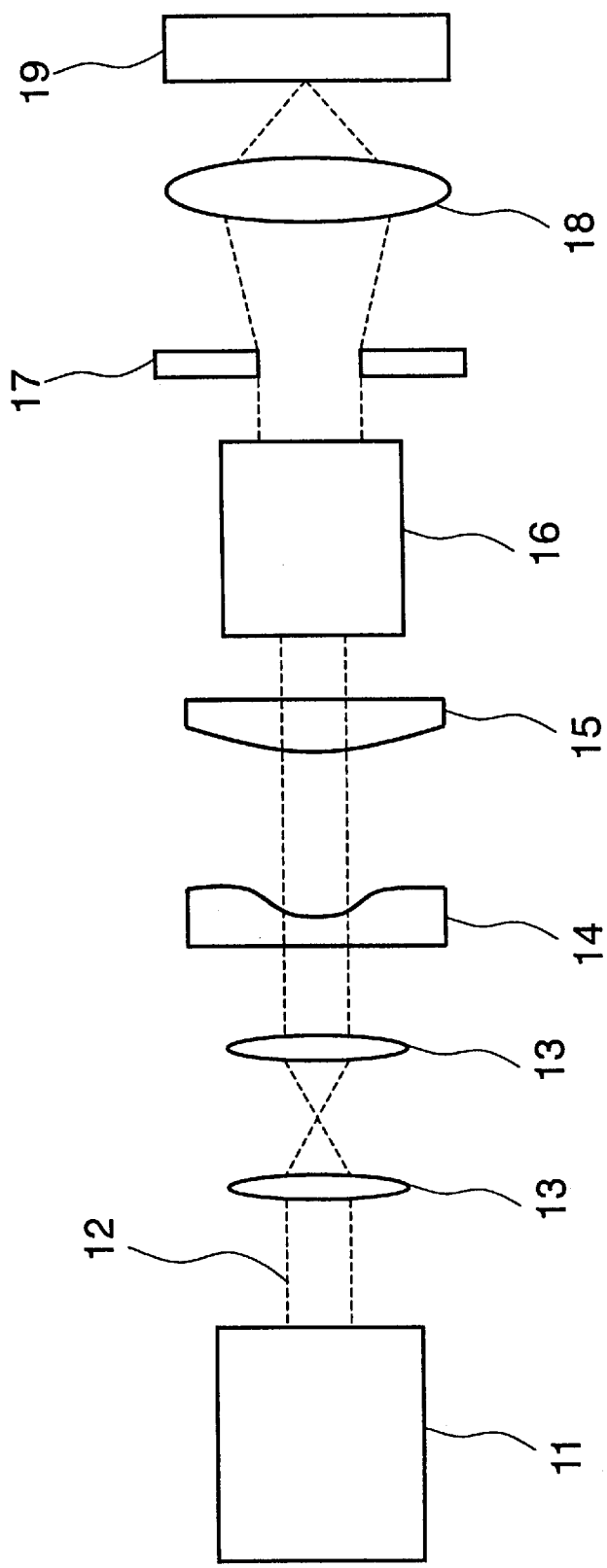
FIG. 1 is a schematic system diagram of a laser processing apparatus according to an embodiment of the invention.

FIG. 1 is a schematic system diagram of a laser processing apparatus according to an embodiment of the present invention. In FIG. 1, a $CO_2$ laser oscillator 11 oscillating a laser beam of the TEM00 mode is used as a laser oscillator. The profile of a $CO_2$ laser beam 12 is indicated by dotted lines in FIG. 1. A lens system 13 used in the embodiment is of a Keplerian type formed of two convex lenses. The laser processing apparatus according to the present embodiment further comprises an intensity converting element 14, a phase matching element 15, a variable-magnification projecting optical system 16, a mask 17, and a projecting lens 18 and performs processing on a workpiece 19.

Operation of the laser processing apparatus will be described below.

The beam diameter of laser beam 12 emitted from $CO_2$ laser oscillator 11 is adjusted by lens system 13, and the beam is introduced into intensity converting element 14. The intensity distribution of laser beam 12 in the present embodiment is converted from Gaussian distribution to uniform distribution while the beam is passed through intensity converting element 14 and phase matching element 15.

Figure 2:
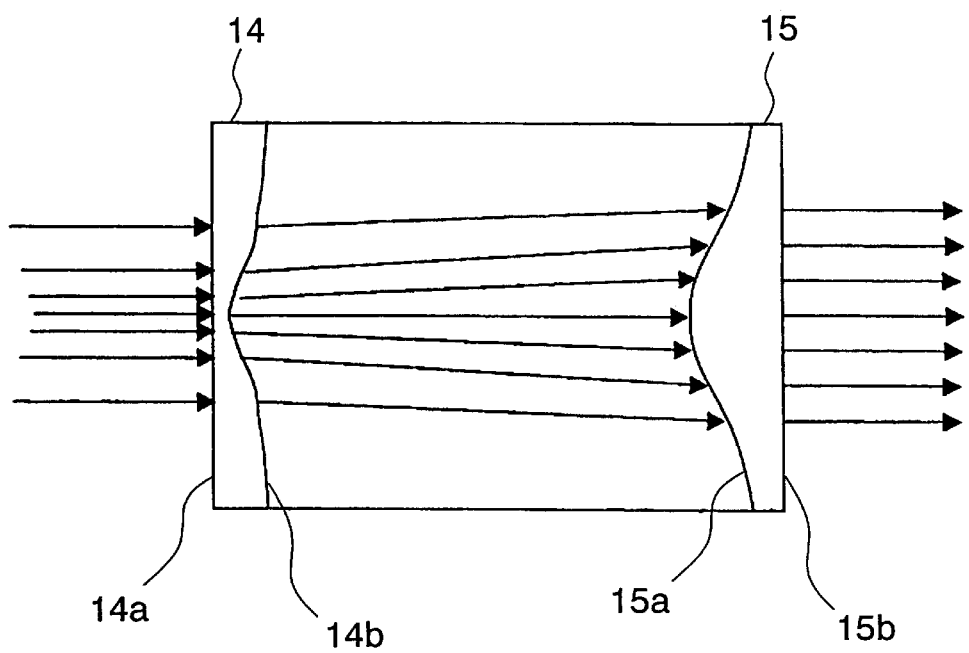
FIG. 2 is an enlarged view schematically showing an intensity converting element and a phase matching element in an embodiment of the invention.

FIG. 2 is an enlarged view of intensity converting element 14 and phase matching element 15 in FIG. 1. In FIG. 2, the intensity distribution of the laser beam is expressed by luminous flux density. In FIG. 2, a surface 14a of intensity converting element 14 on the side on which the laser beam is incident is a flat surface. A surface 14b of intensity converting element 14 on the side from which the laser beam is emitted is an aspheric surface. Surface 15a of phase matching element 15 on the side on which the laser beam is incident is an aspheric surface. A surface 15b of phase matching element 15 on the side from which the laser beam is emitted is a flat surface. In other words, intensity converting element 14 and phase matching element 15 in the present embodiment are aspherical lenses each having a flat surface on one side and an aspheric surface on the other side.

In the design of the aspheric surface portion of intensity converting element 14, the beam is expanded to some degree in the central portion of the surface where the beam intensity is high, and the degree of expansion of the beam is made smaller in the peripheral portion where the beam intensity is low as compared with that in the central portion, so that the intensity of the emitted beam is uniformly distributed. On the other hand, rays of the expanded beam are restored to parallel rays, convergent rays, or divergent rays.

In order to explain the behavior of the beam qualitatively, the laser beam was compared above to rays of light based on the idea of geometrical optics. However, according to a more strict idea of wave optics, intensity converting element 14 distorts the wave surface of a laser beam from a spherical surface or a flat surface by means of aspheric surface 14b, so that the laser beam is given uniform intensity distribution at the position of phase matching element 15.

Further, phase matching element 15 adjusts the wave surface distorted by intensity converting element 14 to a flat surface or a spherical surface by means of aspheric surface 15a. As a result, the intensity distribution of the laser beam becomes uniform and matched in phase at the position of phase matching element 15.

Figure 3A:
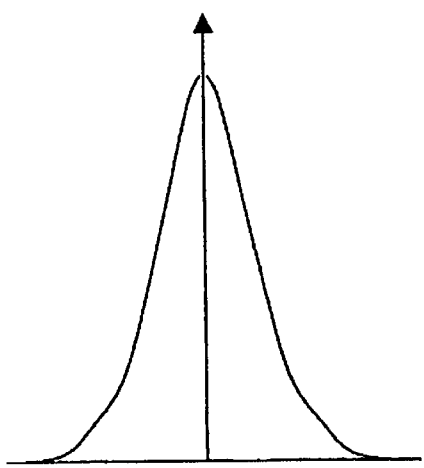
FIG. 3 is a schematic drawing showing intensity distribution of a laser beam in an embodiment of the invention.
Figure 3B:
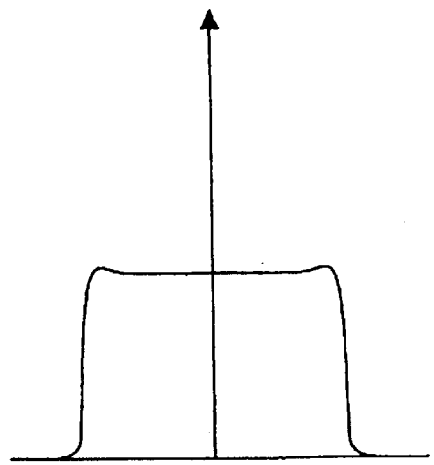

FIG. 3(a) shows the intensity distribution of laser beam 12 in Gaussian distribution at incident surface 14a of intensity converting element 14 and FIG. 3(b) shows the intensity distribution of laser beam 12 in uniform distribution at emitting surface 15b of phase matching element 15.

Laser beam 12 transmitted through phase matching element 15 is then transmitted through variable-magnification projecting optical system 16 and thrown on mask 17. Variable-magnification projecting optical system 16 projects the image at the position of phase matching element 15 onto the position of mask 17. In other words, the position of phase matching element 15 and the position of mask 17 are conjugate with respect to variable-magnification projecting optical system 16. More specifically, while the laser beam having uniform intensity distribution and matched phases at the position of phase matching element 15 loses the uniformity in intensity as it travels, it restores the uniform intensity distribution at the position of mask 17 upon being projected thereon by variable-magnification projecting optical system 16. The laser beam also restores the matched phase distribution at the position of mask 17. The projective magnification of variable-magnification projecting optical system 16 is variable and, hence, the size of the region of intensity distribution of the laser beam at the position of mask 17 can be adjusted.

Figure 4:
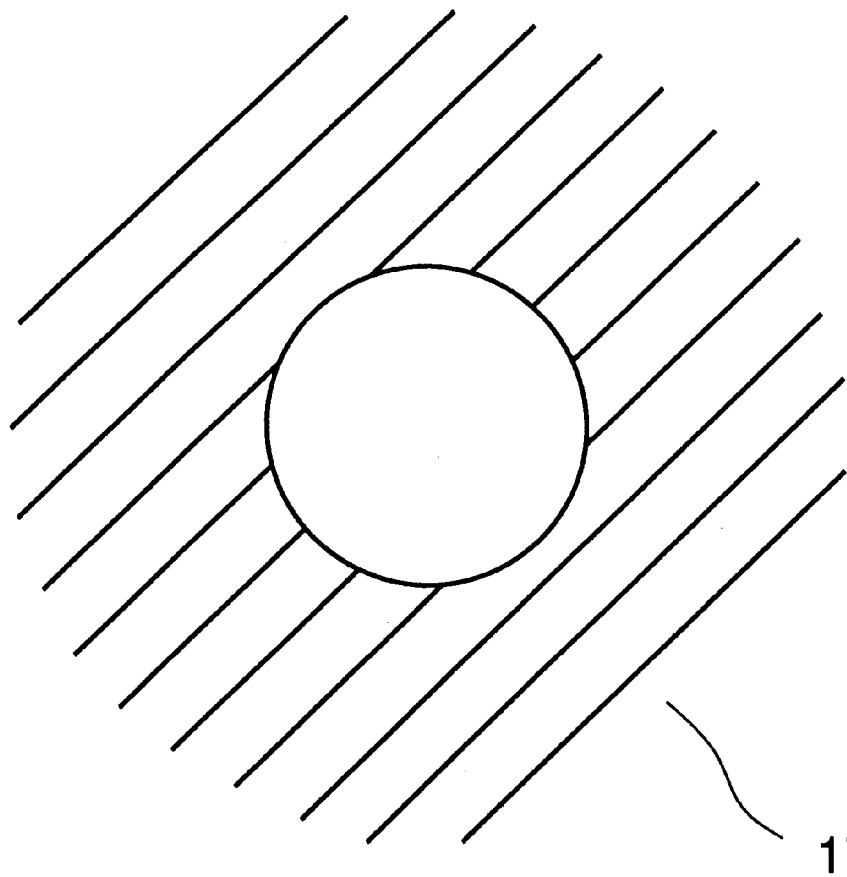
FIG. 4 is a schematic view of a mask in an embodiment of the invention seen from the direction of the optical axis.

FIG. 4 is a view of mask 17 seen from the direction of the optical axis of the laser beam. In FIG. 4, the diagonally shaded area shows the screening portion and the area inside the same is the aperture. In the present embodiment, the aperture is made circular. The size of the aperture is variable and, hence, it can be adjusted to a suitable size for processing. Variable-magnification projecting optical system 16 projects the intensity distribution of the laser beam at the position of phase matching element 15 onto mask 17 such that an optimum area of mask 17 with respect to the size of the aperture therein is irradiated by the laser beam. Thereby, the laser beam energy can be utilized to the full extent.

Figure 5A:
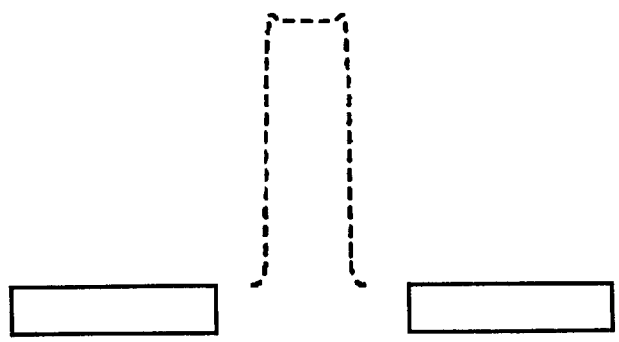
FIG. 5 is a schematic drawing showing a relationship between the size of a mask and an irradiated domain by different intensity distributions of laser beams in an embodiment of the invention.

FIGS. 5(a), (b), and (c) are drawings showing relationships between the size of the mask aperture and the area irradiated by the laser beam. In the drawings, intensity distributions of the laser beam are indicated by dotted lines.

FIG. 5(a) shows a case where the area irradiated by the laser beam is smaller than the size of the mask aperture. In this case, the intensity of the laser beam is present only inside the mask aperture and hence there is no meaning to the shielding by the mask.

Figure 5B:
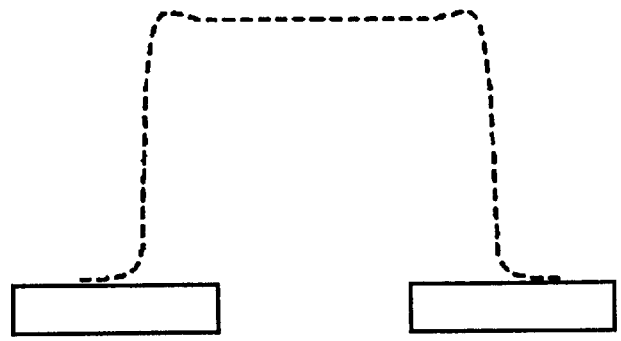

When the irradiated area by the laser beam is too large as compared with the mask aperture as shown in FIG. 5(b), the energy blocked by the shielding portion of the mask becomes too much and hence the energy utilization efficiency is lowered.

Figure 5C:
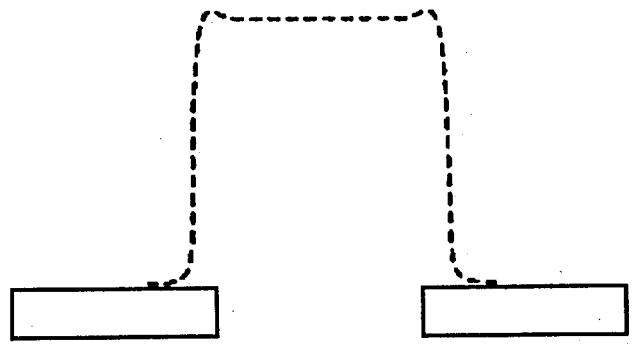

In the present embodiment, as shown in FIG. 5(c), the projective magnification of variable-magnification projecting optical system 16 is adjusted such that most of the portion with uniform intensity distribution of the laser beam irradiates the aperture of mask 17.

Figure 6:
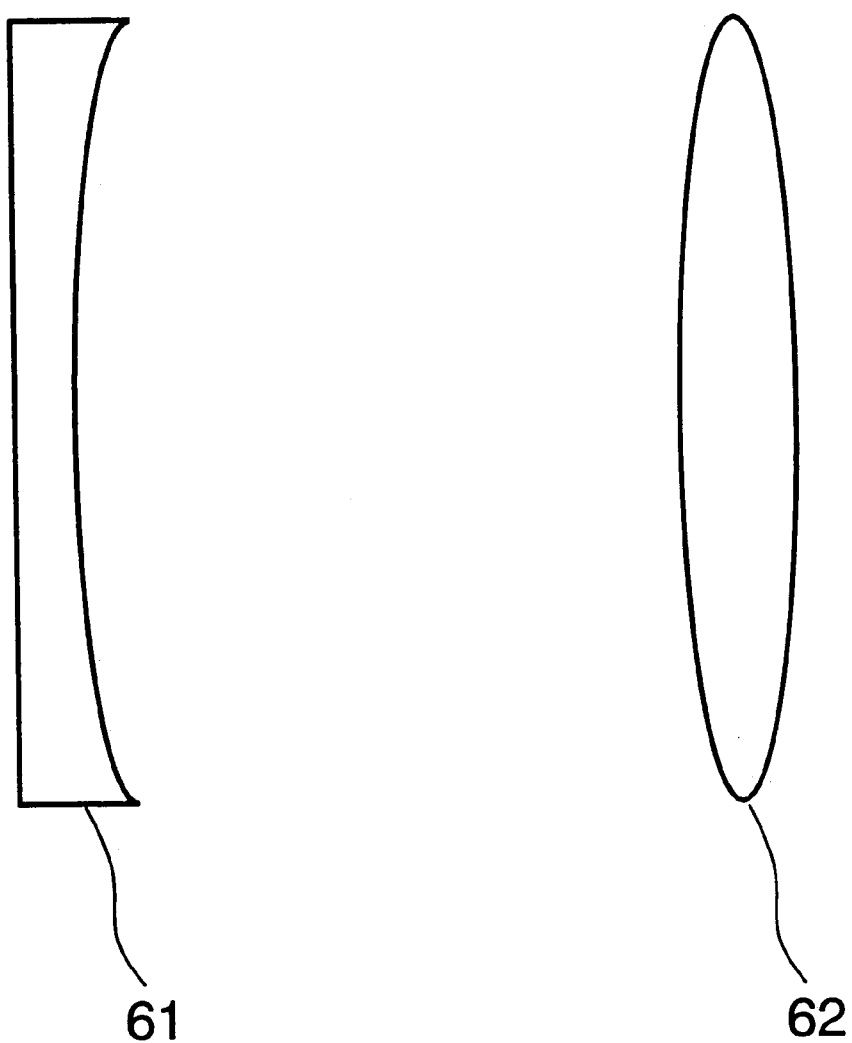
FIG. 6 is an enlarged view schematically showing a variable-magnification projecting optical system in an embodiment of the invention.
Figure 7:
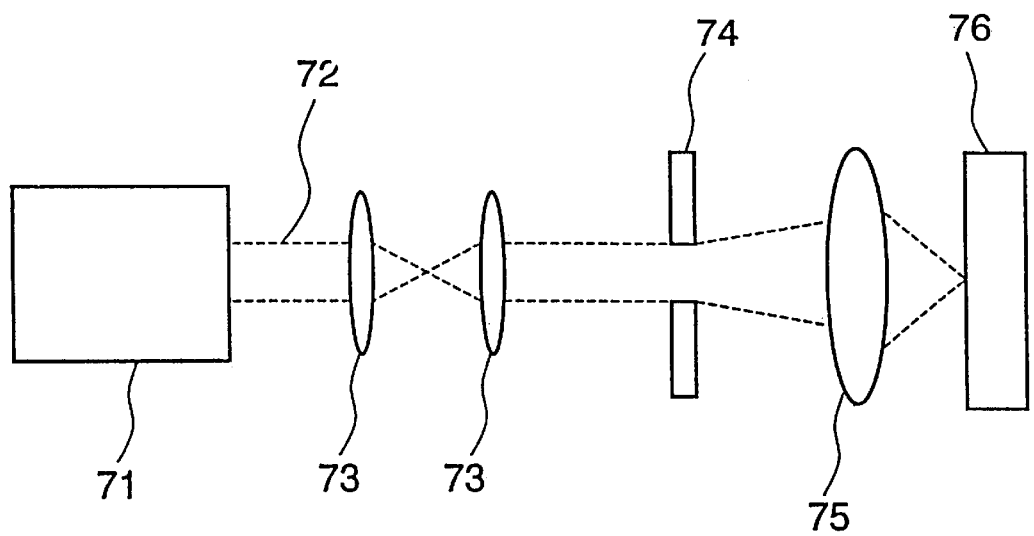
FIG. 7 is a schematic system diagram of a prior art laser processing apparatus.

FIG. 6 is an enlarged view of the variable-magnification projecting optical system in the present embodiment. In FIG. 6, variable-magnification projecting optical system 16 is formed of a concave lens 61 and a convex lens 62. In the present embodiment, concave lens 61 is placed on the side of phase matching element 15 and convex lens 62 is placed on the side of mask 17. Variable-magnification projecting optical system 16 projects the intensity distribution of the laser beam at the position of phase matching element 15 onto the position of mask 17. Further, in the present embodiment, concave lens 61 and convex lens 62 are arranged to be movable in the direction of the optical axis independently of each other. By changing the distance between concave lens 61 and convex lens 62, the synthetic focal length of the two lenses, i.e., the focal length of variable-magnification projecting optical system 16, can be changed. The focal length of variable-magnification projecting optical system 16 is given by equation (1) as follows:

$$f=(f_1-f_2+d)/f_1{}^*f_2. \tag{1}$$

In equation (1), f is the focal length of variable-magnification projecting optical system 16, $f_1$ is the absolute value of the focal length of lens 61, $f_2$ is the absolute value of the focal length of lens 62, and d is the distance between lens 61 and lens 62. According to equation 1, the longer the distance between lens 61 and lens 62 is, the shorter becomes the focal length of variable-magnification projecting optical system 16. Therefore, the projective magnification of variable-magnification projecting optical system 16 can be varied by moving lens 61 and lens 62 in the direction of the optical axis such that the focal length is varied, while keeping phase matching element 15 and mask 17 in conjugate relationship. Hence, the intensity distribution of the laser beam on mask 17 can be kept uniform at all times.

Further, when the size of the aperture of mask 17 is changed, the projective magnification of variable-magnification projecting optical system 16 may be varied in accordance with the change in the size. Thus, the range of the intensity distribution of the laser beam can be adapted to a value optimum to the aperture of mask 17 at all times.

Then, the intensity distribution of the laser beam at the aperture of mask 17 is projected onto workpiece 19 by means of projecting lens 18. The position of mask 17 and the position of workpiece 19 are in conjugate relationship with respect to projecting lens 18. Therefore, the intensity distribution of the laser beam on workpiece 19 also becomes uniform. Thus, it becomes possible to perform uniform laser processing on workpiece 19.

When the size of the aperture of mask 17 is variable, the range of the uniform intensity distribution of $CO_2$ laser beam 12 on workpiece 19 given by the product of the size of the aperture of mask 17 and the projective magnification factor of projecting lens 18 can be varied according to the need.

As described above, the laser processing apparatus of the present embodiment comprises a mask for limiting the transmission area of the laser beam to an arbitrary shape, a variable-magnification projecting optical system for projecting a uniform intensity distribution of the laser beam at a predetermined position onto the mask at a magnification factor suited to the transmission area of the mask, and an optical system for projecting the pattern of the mask on the workpiece.

By using the laser processing apparatus of the present embodiment, the intensity distribution of the laser beam on the workpiece can be made uniform all over the transmission area of the mask and allows for high quality processing.

The apparatus further has means for making the intensity distribution of the laser beam uniform at a predetermined position. The means comprises an intensity converting element for making the intensity distribution of the laser beam uniform at a predetermined position and a phase matching element for matching the phase of the laser beam once distorted by the intensity converting element. By virtue of the above described arrangement, the intensity distribution of the laser beam on the workpiece can be provided with a uniform distribution suited to the size of the aperture of the mask and thus high-quality processing can be attained.

Further, by providing the means for making the intensity distribution of the laser beam uniform with a lens system set up in front of the intensity converting element, it becomes possible to limit variations of the beam diameter of the laser beam entering the intensity converting element. Thereby, it becomes possible for the apparatus to provide stable and high-quality processing.

Although a laser beam in the TEM00 mode was used as the laser beam emitted from the laser oscillator in the above embodiment, the intensity converting element and the phase matching element can be suitably designed for modes other than the TEM00 mode, such as a laser beam having high-order modes mixed therein, or a guide mode, or a mode oscillated by an unstable resonator.

Although, the size of the aperture of mask 17 was described to be variable in the above embodiment, masks may be arranged to be detachable and the mask having the most suitable size of aperture can be used according to the type of processing. Although the shape of the aperture of mask 17 was described to be circular, it is not limited to being circular.

Although, variable-magnification projecting optical system 16 was described as being formed of concave lens 61 and convex lens 62, the number of lenses is not limited to two; more than two lenses may be used. Further, variable-magnification projecting optical system 16 may be formed not only of lenses but also of reflecting mirrors or the like.

In other words, variable-magnification projecting optical system 16 can be constructed not only of a transmission type optical system such as lenses, but also of a reflection type optical system or other optical system, provided that the optical system projects the beam intensity and phase at the position of phase matching element 15 onto the position of mask 17.

Although variable-magnification projecting optical system 16 was formed of elements movable in the direction of the optical axis, it may be arranged so that individual elements are detachable and the optical system capable of projecting a beam at a magnification factor most suited to the size of a mask is formed each time.

Although, in the present embodiment, the laser beam entering variable-magnification projecting optical system 16 was described as being a beam which has been transmitted through lens system 13 and means for making the intensity distribution of the laser beam uniform at a predetermined position, namely intensity converting element 14 and phase matching element 15 in the present case, it is not limited to such a beam. Any laser beam can be used if it has a uniform intensity distribution at the position of entering variable-magnification projecting optical system 16.

A configuration in which the intensity converting element and the phase matching element are formed of two aspherical lenses was shown in the above embodiment as an example of the means for making the intensity distribution of laser beam 12 uniform at a predetermined position. However, the means may be structured of binary optics and, further, the number of lenses is not limited to two.

Although transmission type elements were used in the present embodiment as the means for making the intensity distribution of the laser beam uniform at a predetermined position, reflection type elements may be used, instead.

While a structure additionally provided with lens system 13 was shown as one of the means for making the intensity distribution of laser beam 12 uniform at a predetermined position, the structure of lens system 13 is not limited to that formed of two convex lenses, but it may be that of the Galilean type formed of a convex lens and a concave lens, and the number of lenses is not limited to two. Further, a certain number of reflecting mirrors or the like may be used instead of lens system 13.

Although the $CO_2$ laser beam was used as the laser beam in the embodiment, any other laser beam suited to processing such as a YAG laser, a He-Ne laser, or the like may be used.

According to the present invention as described above, it is made possible to convert a laser beam into a beam having a phase-matched and uniformly distributed intensity by means of an intensity converting element and a phase matching element, to irradiate a mask with the beam given a range of uniform intensity distribution suited to the aperture of the mask by means of a variable-magnification projecting optical system, and to project the intensity distribution of the laser beam at the aperture of the mask onto a workpiece. Thus, highly uniform laser beam processing becomes possible and processing with stable quality can be performed.

What is claimed is:

1. A laser processing apparatus comprising:

a mask containing an aperture;

a variable-magnification projecting optical system for projecting a laser beam with an intensity distribution at a predetermined position onto said mask;

an optical system for projecting a pattern of said mask onto a workpiece; and an arrangement for making the intensity distribution of a laser beam uniform at a predetermined position, wherein said arrangement comprises an intensity converting element and a phase matching element.

2. The laser processing apparatus according to claim 1, wherein said intensity converting element and phase matching element each have one of the surfaces thereof being an aspheric surface.

3. The laser processing apparatus according to claim 1, wherein said arrangement further comprises a lens system.

4. The laser processing apparatus according to claim 3, wherein said intensity converting element and phase matching element each have one of the surfaces thereof being an aspheric surface.

5. The laser processing apparatus according to claim 1, wherein said variable-magnification projecting optical system is made up of an arbitrary number of optical transmission systems or optical reflection systems.

6. The laser processing apparatus according to claim 5, wherein optical elements constituting the optical transmission systems or optical reflection systems are movable along the optical axis of the laser beam.

7. The laser processing apparatus according to claim 1, further comprising a $CO_2$ laser oscillator for generating the laser beam.

8. The laser processing apparatus according to claim 1, wherein the aperture in said mask is variable in area.

9. The laser processing apparatus according to claim 8, wherein the aperture in said mask is circular in shape.

10. A laser processing apparatus comprising:

a mask containing an aperture;

a variable-magnification projecting optical system for projecting a laser beam with an intensity distribution at a predetermined position onto said mask;

an optical system for projecting a pattern of said mask onto a workpiece; and wherein said variable-magnification projecting optical system is constituted of an arbitrary number of detachable optical transmission elements or optical reflection elements.

11. A laser processing method comprising:

converting a laser beam having a uniform intensity distribution at a predetermined position into a magnified laser beam;

limiting the magnified laser beam to an arbitrary shape;

projecting the laser beam limited to an arbitrary shape onto a workpiece for processing the workpiece; and wherein said converting of the laser beam is performed by the use of an arbitrary number of detachable optical transmission elements or optical reflection elements.

12. A laser processing method comprising:

converting a laser beam having a uniform intensity distribution at a predetermined position into a magnified laser beam;

limiting the magnified laser beam to an arbitrary shape;

projecting the laser beam limited to an arbitrary shape onto a workpiece for processing the workpiece; and making the intensity distribution of the laser beam uniform by performing intensity conversion of the laser beam, and performing phase matching of the laser beam.

13. The laser processing method according to claim 12, wherein said making the intensity distribution of the laser beam uniform further comprises regulating the beam diameter of the laser beam.

14. The laser processing method according to claim 12, wherein the optical element used for intensity conversion and the optical element used for phase matching each have one of the surfaces thereof being an aspheric surface.

15. The laser processing method according to claim 12, wherein said converting of the laser beam is performed by the use of an arbitrary number of optical transmission elements or optical reflection elements.

16. The laser processing method according to claim 15, wherein the elements of the optical transmission elements or the optical reflection elements are movable along the optical axis of the laser beam.

17. The laser processing method according to claim 15, wherein the elements of the optical transmission elements or the optical reflection elements are detachable.

18. The laser processing method according to claim 12, wherein the shape subjected to limiting in said limiting of the laser beam is variable in size.

19. The laser processing method according to claim 12, wherein the shape subjected to limiting in said limiting of the laser beam is circular.

20. The laser processing method according to claim 12, wherein the laser beam is generated by a $CO_2$ laser oscillator.

21. The laser processing method according to claim 13, wherein said converting of the laser beam is performed by the use of an arbitrary number of optical transmission elements or optical reflection elements.

22. The laser processing method according to claim 13, wherein the optical element used for intensity conversion and the optical element used for phase matching each have one of the surfaces thereof being an aspheric surface.

* * * * *